(12) United States Patent
Bhatt

(10) Patent No.: US 7,566,877 B2
(45) Date of Patent: Jul. 28, 2009

(54) SYSTEMS, METHODS, AND APPARATUS FOR A KINETIC ENERGY ABSORBING DEVICE

(76) Inventor: Vivek Bhatt, 15375 Cascade Dr., Elm Grove, WI (US) 53122

( * ) Notice: Subject to any disclaimer, the term of this patent is extended or adjusted under 35 U.S.C. 154(b) by 0 days.

(21) Appl. No.: 11/047,336

(22) Filed: Jan. 28, 2005

(65) Prior Publication Data

US 2006/0169906 A1 Aug. 3, 2006

(51) Int. Cl.
*H01L 27/146* (2006.01)
*B65D 81/02* (2006.01)

(52) U.S. Cl. ............... 250/370.09; 206/586; 206/591

(58) Field of Classification Search ............ 250/370.09; 206/586, 591
See application file for complete search history.

(56) References Cited

U.S. PATENT DOCUMENTS

| 5,796,109 | A | 8/1998 | Frederick et al. | |
|---|---|---|---|---|
| 6,464,080 | B1 * | 10/2002 | Morris et al. | 206/591 |
| 6,495,834 | B1 * | 12/2002 | Corvo et al. | 250/363.1 |
| 6,661,604 | B2 * | 12/2003 | Hashizume et al. | 360/97.02 |
| 2006/0071172 | A1 * | 4/2006 | Ertel et al. | 250/370.11 |

FOREIGN PATENT DOCUMENTS

| JP | 2002014170 | | 1/2002 |
|---|---|---|---|
| WO | WO 2003074387 | A1 * | 9/2003 |

* cited by examiner

*Primary Examiner*—David P Porta
*Assistant Examiner*—Shun Lee
(74) *Attorney, Agent, or Firm*—William Baxter; Ellis B Ramirez; Michael G. Smith

(57) ABSTRACT

Systems, methods and apparatus are provided through which an impact absorbing material is affixed to a transportable device to protect the transportable device from impact with another object. In some embodiments, the impact absorbing material is a crumple zone material that has plastic deformation characteristics.

20 Claims, 29 Drawing Sheets

402

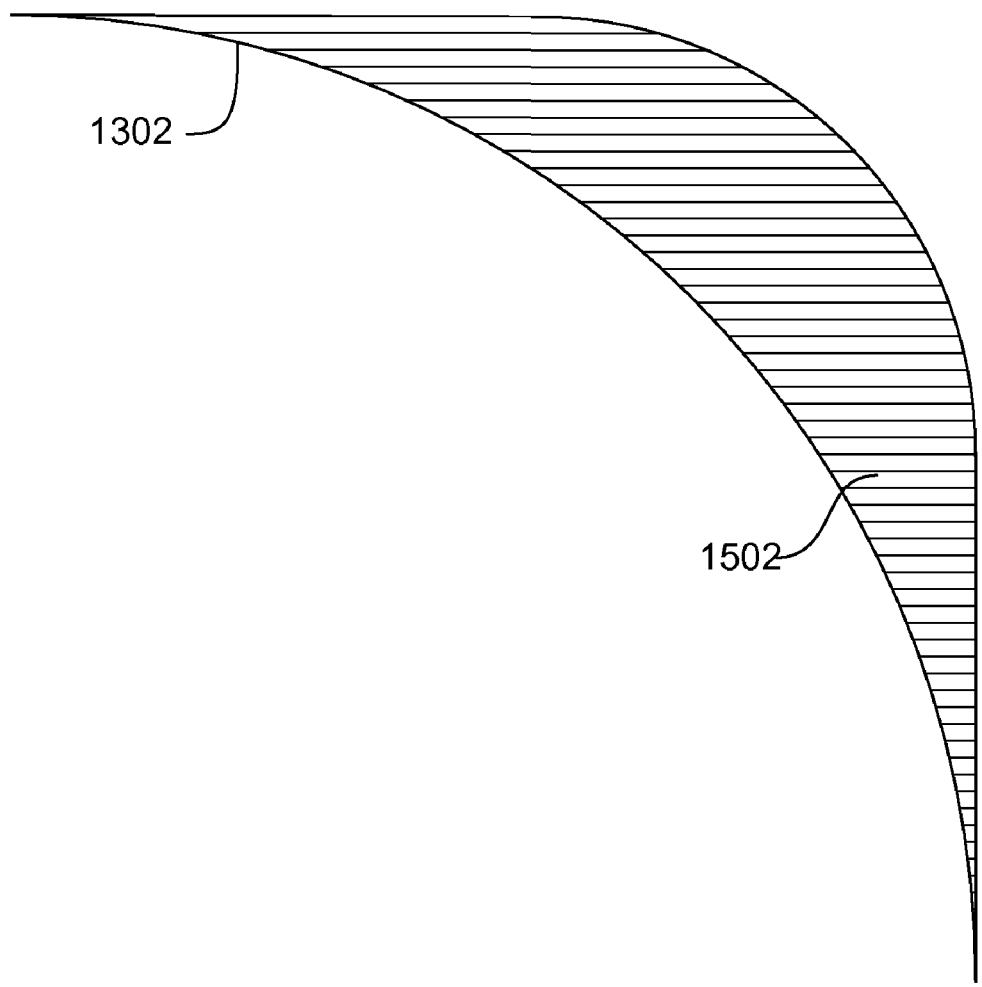
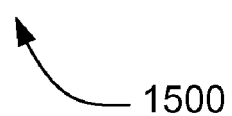
FIG. 15

SYSTEMS, METHODS, AND APPARATUS FOR A KINETIC ENERGY ABSORBING DEVICE

FIELD OF THE INVENTION

This invention relates generally to an energy absorbing material, and more particularly to an energy absorbing material attached to a device.

BACKGROUND OF THE INVENTION

In a world of ever-increasing miniaturization of electronic devices, more and more equipment and/or devices are being designed in portable or hand-held packaging. These devices are transportable and are either free standing and hand-held in conventional use, or are removable from the structure within which the hand-held device is often mounted. Transportable devices include cellular phones, personal digital assistants (PDAs), and laptops. More recently, with an increase in demand for flexibility in imaging needs for medical and industrial use, fixed X-Ray detectors are being redesigned and being called upon for transportable uses.

Interest in transportable uses of electronic devices, and the decrease in the size and weight of the devices is causing testing equipment as well hand-held devices to be transported and handled more often. Thus, the electronic devices are at a much greater risk for a significant amount of impact or bumping, and from which the devices need to be protected or hardened against.

Typically, accidental drops of transportable devices are of the order of one meter, where the device falls from a table-top, storage shelf or a bed, or while being carried around by hand. Various approaches have been used to make the devices rugged by using absorbing materials, covers, sleeves and carrying cases that protect the devices in case of such drops or from being tipped over. Though a straightforward and simple solution, this approach suffers from four main limitations when applied to certain types of applications. First, the approach of adding a significant amount of absorbing material tends to bulk up the device and defeats the very desire to make them lighter and more portable. Second, these forms of absorbing material can sometimes be inappropriate for certain working environments, such as in the medical field. Third, the use of sleeves or covers can be cumbersome to install and remove, and may also impede the operation of the device. Finally, conventional systems often give no indication of the extent of, if any at all, the severity of the impact event and provide no lasting feedback to the users that they might be frequently inappropriately mishandling the devices.

For the reasons stated above, and for other reasons stated below which will become apparent to those skilled in the art upon reading and understanding the present application, that there is a need in the art to protect devices against shock from accidental drops, bumping or tipping over without the use of sleeves or covers. There is also a need in the art to provide the end user with information and feedback on the extent, if any at all, of the severity of an impact event. There is also a need in the art to provide the end user with information as to whether or not the impact absorption qualities of the impact absorbing material has yet been permanently altered by any absorption of impact energy.

BRIEF DESCRIPTION OF THE INVENTION

The above-mentioned shortcomings, disadvantages and problems are addressed herein, which will be understood by reading and studying the following specification.

In one aspect, an apparatus for absorbing an impact imparted to a device includes device, and an impact absorbing material affixed to the exterior of the device in which the impact absorbing material is permanently deformed upon encountering an impact event of sufficient force. The material will plastically deform as the material absorbs the energy of impact. By deforming plastically, the material provides a significantly higher level of shock absorption, while at the same time providing a visual record of the transportable device having been dropped. The improved shock absorption improves the reliability and longevity of the transportable device. Examples of the device include transportable devices.

In another aspect, the impact absorbing material includes a crumple zone material made from impact absorbing materials including but not limited to a metallic material, a paper or cardboard material, a plastic, or a composite material, and may be made from a single piece or a plurality of symmetrical cells and/or a plurality of asymmetrical cells.

In still another aspect, the absorbing material has a pre-impact shape. The impact absorbing material reforms to the pre-impact shape after impact for impacts that are below a certain threshold.

In a further aspect, the impact absorbing material is made from a crumple zone material that is tuned to absorb a predetermined number of impact events whereupon the crumple zone material becomes permanently deformed beyond a certain visual threshold. The permanently deformed impact absorbing material provides a visual indication of mechanical shock, which is helpful to the manufacturer or the maintenance and service provider of the transportable device in determining that the transportable device has been physically abused to the extent that the financial burden of replacing the transportable device is beyond the responsibility to the manufacturer, or the maintenance or service provider. This further aspect provides both mechanical protection to the transportable device along with a visual indication of mechanical abuse.

Apparatus, systems, and methods of varying scope are described herein. In addition to the aspects and advantages described in this summary, further aspects and advantages will become apparent by reference to the drawings and by reading the detailed description that follows.

BRIEF DESCRIPTION OF THE DRAWINGS

FIG. 15 is a cross section diagram of organic crumple zone material, according to an embodiment;

DETAILED DESCRIPTION OF THE INVENTION

In the following detailed description, reference is made to the accompanying drawings that form a part hereof, and in which is shown by way of illustration specific embodiments which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

The detailed description is divided into four sections. In the first section, a system level overview is described. In the second section, apparatus of embodiments are described. In the third section, methods of embodiments are described and finally, in the fourth section, a conclusion of the detailed description is provided.

System Level Overview

Figure 1:
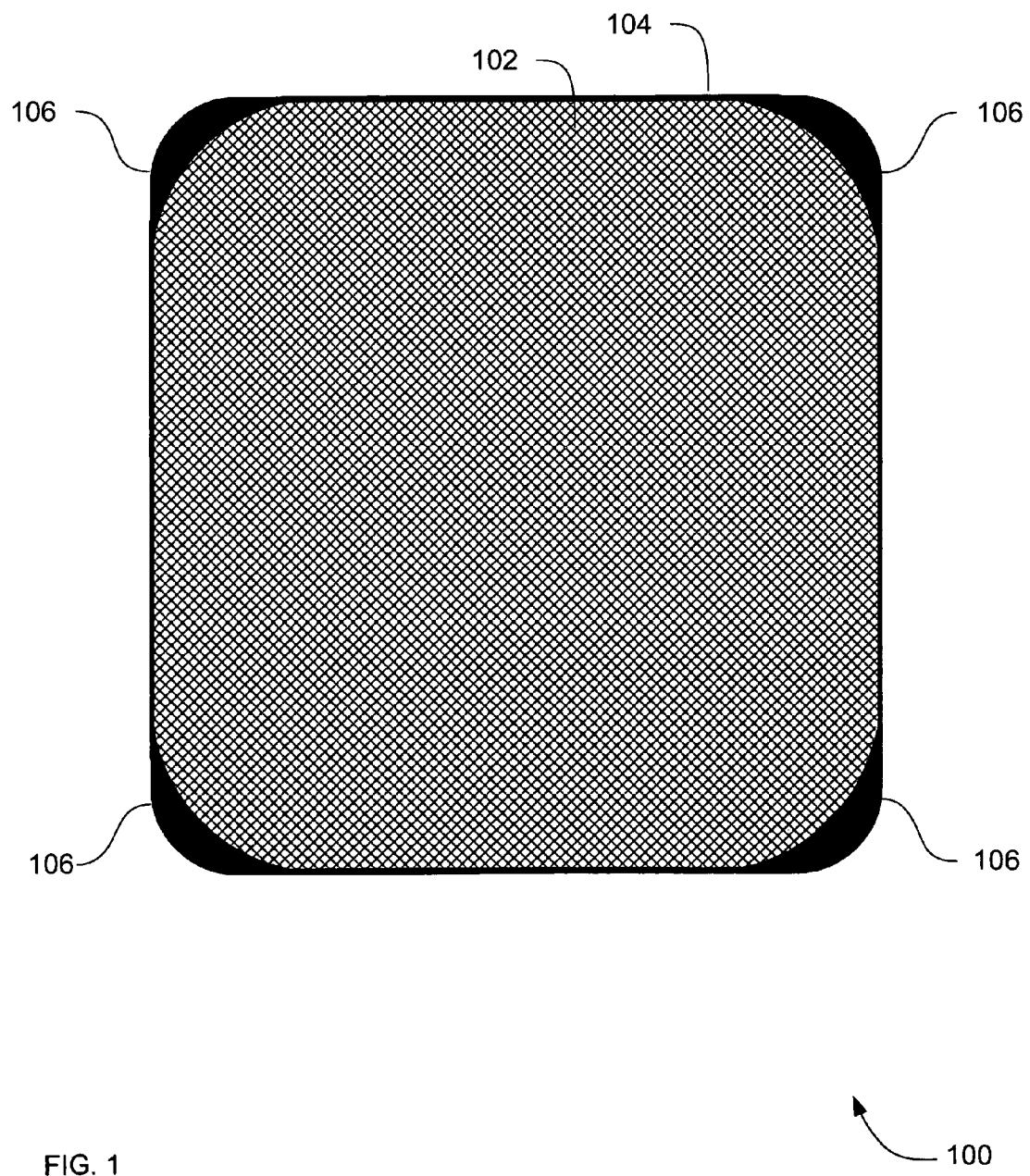
FIG. 1 is a block diagram that provides a system level overview of an apparatus for absorbing an impact imparted to a transportable device, according to an embodiment.

FIG. 1 is a block diagram that provides a system level overview of an apparatus for absorbing an impact imparted to a transportable device, according to an embodiment. System 100 solves the need in the art to protect transportable devices against shock to provide the end user with information on the extent, if any at all, of the severity of an impact event.

System 100 includes the transportable device 102. The transportable device 102 is a device that can be carried by an adult human without strenuous effort. Transportable devices typically weight less than 14 kilograms (30 lbs). The transportable device 102 may be an electronic transportable device such as an electronic X-Ray detector, a defibrillator device or an ultrasound device, or a personal digital assistant, laptop computer, medical device, cellular phone, or a computer notebook. The transportable device 102 has an exterior surface 104.

System 100 also includes an impact absorbing material 106 affixed to the exterior surface 104 of the transportable device 102. The impact absorbing material 106 has elastic-plastic capabilities that allow the impact absorbing material 106 to reform to the pre-impact shape of the impact absorbing material 106 if the impact is below a certain threshold. Nonetheless, the impact absorbing material 106 is permanently deformed upon encountering an impact event of a sufficient force (not shown). The impact absorbing material 106 protects the transportable device against shock from accidental drops, bumping or tipping over without the use of sleeves or covers, provides the end user with information on the extent, if any at all, of the severity of an impact event, and provide information as to whether or not the impact absorption qualities of the impact absorbing material has yet been permanently altered by any absorption of impact kinetic energy.

In some embodiments, the impact absorbing material 106 is attached to at least one corner of the transportable device 102. Where the transportable device 102 is a hand-held electronic device, many of the hand held devices are of a regular shape with faces, edges and corners. For accidental drops, the probability of a hand held device landing on one of its corner first is considerably more than the probability of the transportable device landing flat on a face or an edge. As a result, the corners are the points where the kinetic energy of impact is typically first absorbed, and as a result are the points where the highest amount of kinetic energy needs to be absorbed In some embodiments, the impact absorbing material 106 is removably attached, such as by one or more snaps or one or more screws or a hook and loop system or any other methods available to anyone skilled in the art of attachment of dissimilar materials. The removable attachment provides for ready attachment and removal of the impact absorbing material 106, thus the removable attachment allows the impact absorbing material 106 to be attached or removed by field service technicians.

In system 100, the impact absorbing material 106 does not form a part of the overall mechanical seal integrity of the transportable device 102. In other embodiments, the impact absorbing material 106 does not form a part of the overall mechanical seal integrity of the transportable device 102. However the system 100 is not limited to this instantiation, and can be applied to cases where the impact absorbing material is a part of the overall seal integrity of the device it is attached to. In the embodiments where the impact absorbing material 106 does not form a part of the overall mechanical seal integrity of the transportable device 102, the impact absorbing material 106 is more readily attached and/or removed by field service technicians.

The material and geometric dimensions of the impact absorbing material 106 is adapted to the weight and geometry of the transportable device 102, and to the extent of physical protection that is required of the impact absorbing material 106.

While the system 100 is not limited to any particular transportable device 102, exterior surface 104 or impact absorbing material 106, for sake of clarity a simplified transportable device 102, exterior surface 104 or impact absorbing material 106 are described.

Alternatively, the transportable device 102 is adapted to receive the crumple zone material.

Figure 2:
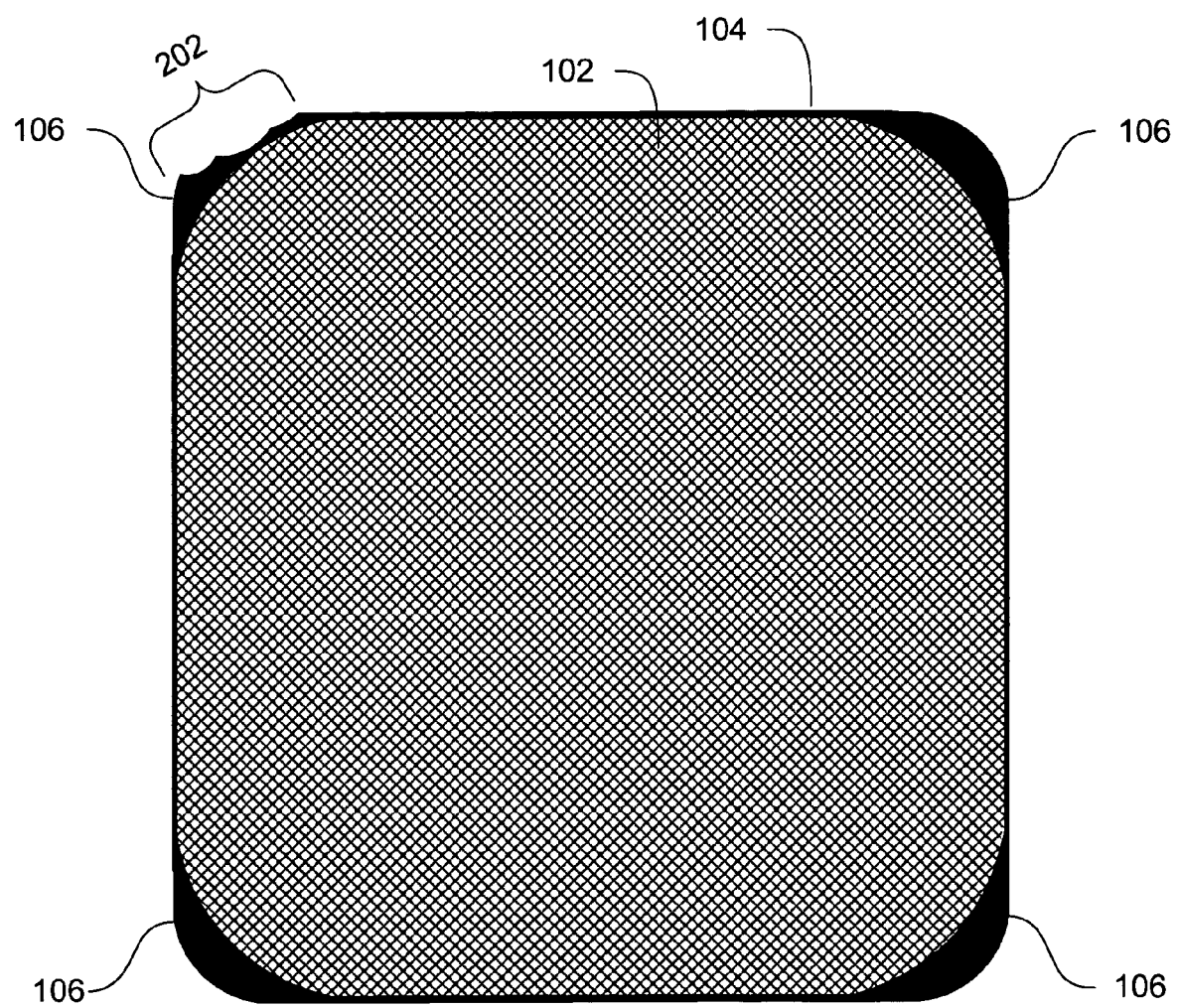
FIG. 2 is a block diagram that provides a system level overview of an apparatus that has absorbed an impact imparted to a transportable device, according to an embodiment.

FIG. 2 is a block diagram that provides a system level overview of an apparatus 100 that has absorbed an impact imparted to a transportable device, according to an embodiment. FIG. 2 shows system 100 after absorbing an impact imparted to transportable device 102. After sustaining an impact of a sufficient force, absorbing material is permanently deformed, yielding deformation 202.

Figure 3:
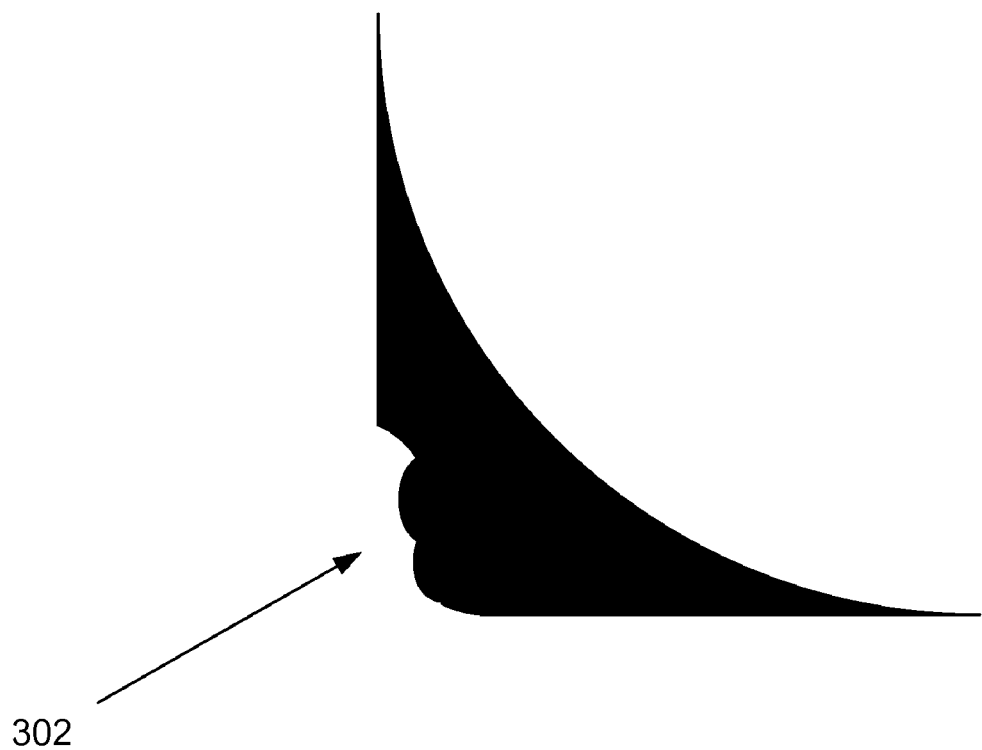
FIG. 3 is a diagram of a deformed crumple zone according to an embodiment.
Figure 4:
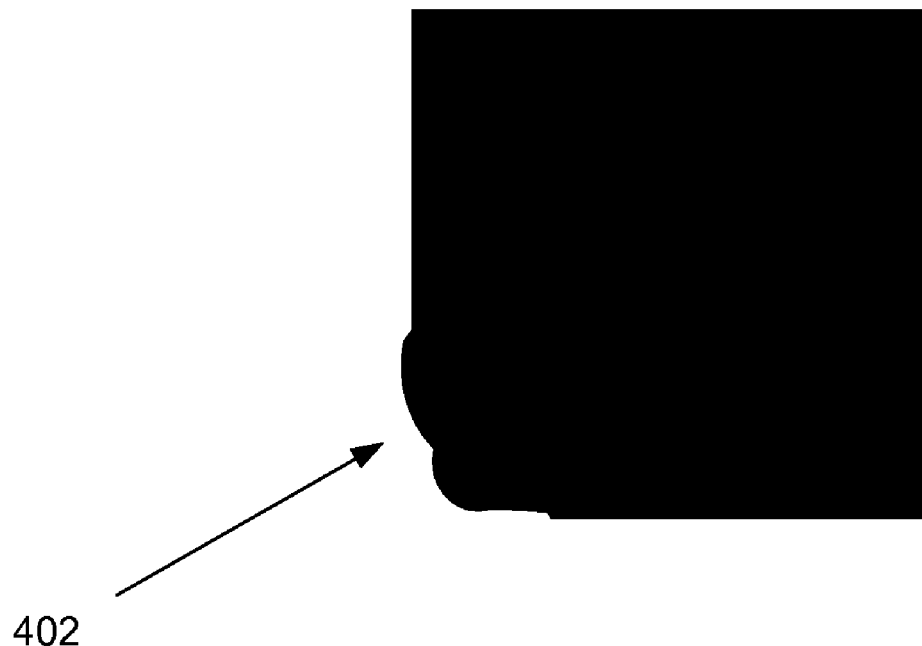
FIG. 4 is a diagram of a deformed crumple zone according to an embodiment.

FIGS. 3 and 4 are diagrams of impact absorbing material 106 after having undergone an impacting event. In FIGS. 3 and 4 impact absorbing material 106 has experienced one or more impact events and is deformed. Deformation 302 and 402 represent the effect of the impact from falling or being tipped over that the transportable device received. Depending on the severity of the deformation, the end user, operator, administrator or maintenance personnel will make a determination as to whether the transportable device is still in condition for use or whether a diagnostic test or maintenance is to be performed before the transportable device is placed back in service.

Apparatus of an Embodiment

In the previous section, a system level overview of the operation of an embodiment was described. In this section, the particular apparatus of such an embodiment are described by reference to a series of diagrams.

Figure 5:
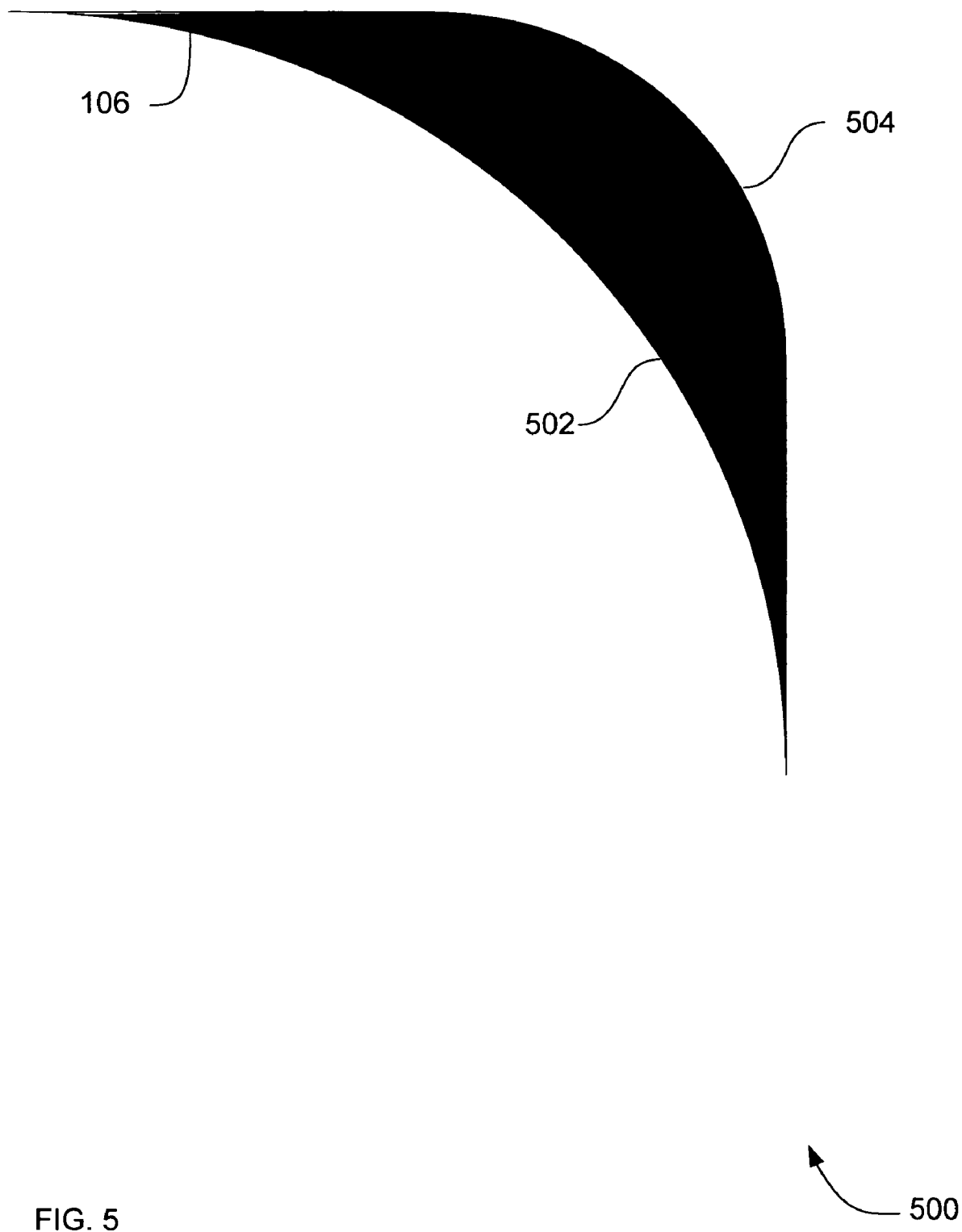
FIG. 5 is a cross section diagram of impact absorbing material, according to an embodiment.

FIG. 5 is a cross section diagram of impact absorbing material 500, according to an embodiment. Impact absorbing material 500 is one embodiment of impact absorbing material 106 in FIG. 1.

The impact absorbing material 500 includes a contoured surface 502 that is adapted to a surface (not shown) of a transportable device so that the entire length of the contoured surface 502 integrates with the surface of the transportable device.

The impact absorbing material 500 also has a convex surface 504 that contacts other objects during an impact. The shape of absorbing material 500 defined by the contoured surface 502 and convex surface 504 are particularly well adapted for attachment to a conventional solid-sate X-Ray detector. Other embodiments of the impact absorbing material that are adapted for attachment to other transportable devices may have fewer or more surfaces and different shaped surfaces to accommodate different transportable devices. The shape and number of surfaces of impact absorbing material 500 is limited only by the requirements of the transportable device.

Figure 6:
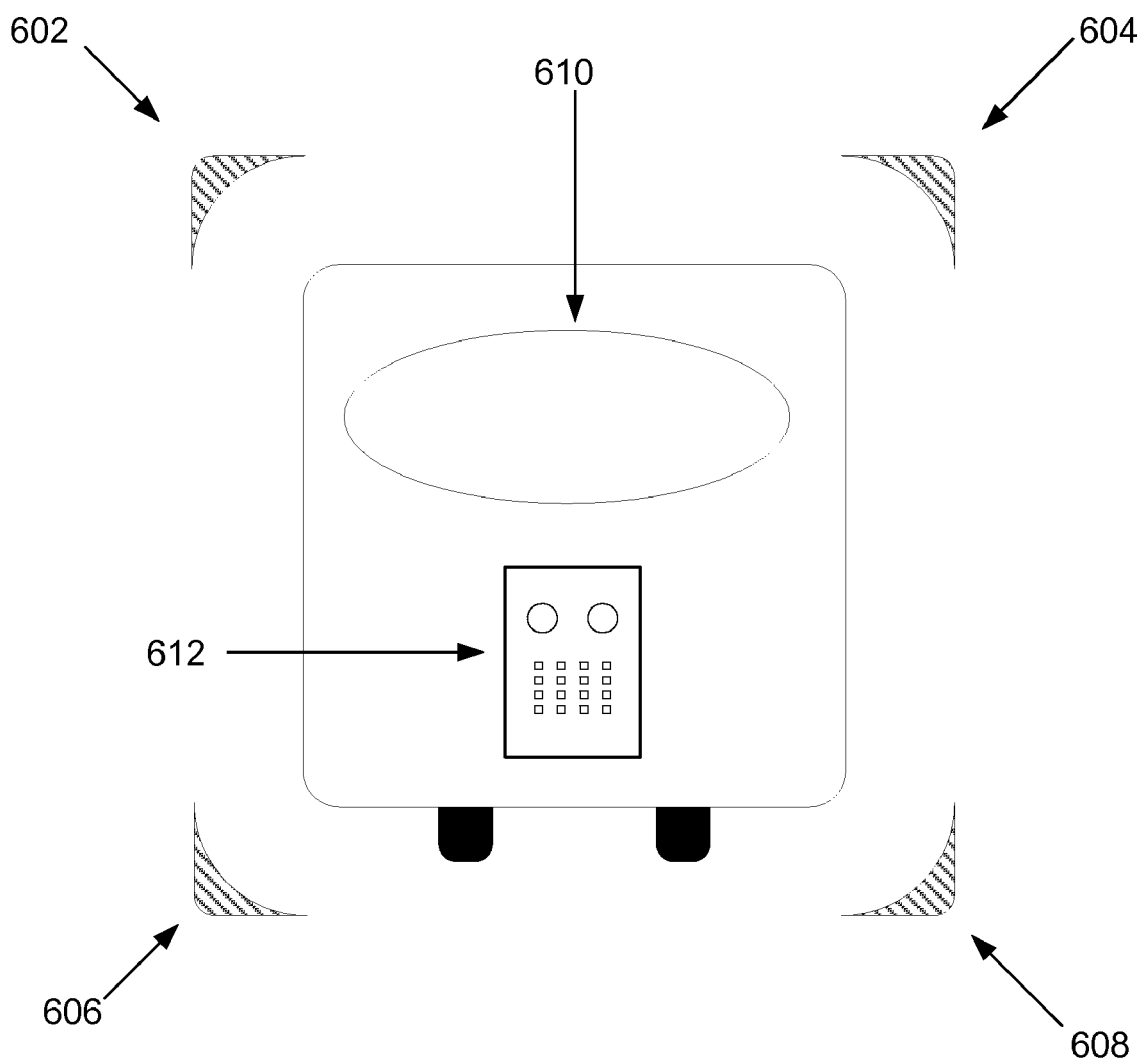
FIG. 6 is a diagram of an explode view of a transportable device with crumple zones detached to the transportable device according to an embodiment.

FIG. 6 is a diagram of a transportable device 102 with impact absorbing material 602, 604, 606 and 608 positioned in proximity to the impact absorbing material attachment location according to an embodiment. Impact absorbing zones 602, 604, 606 and 608 solve the need in the art for impact absorption and the protection of the transportable device while providing the user or maintenance personnel with a readily discernable visual cue or indicator as to the severity of an impacting event or the number of impacting events the transportable device has experienced.

In FIG. 6, transportable device 102 includes a display panel 610, controls 612 and impact absorbing material 602, 604, 606 and 608 strategically placed along the periphery of transportable device 100. In this embodiment the absorbing material 602, 604, 606 and 608 are positioned in FIG. 1 to be affixed to device 100 at the corners of the device. Although, the absorbing material is aligned to be affixed at the corners of device 100, a person of ordinary skill in the art will appreciate that the impact absorbing material can be placed anywhere along the surface of transportable device 102. Furthermore, FIG. 1 discloses multiple potential sites for affixing the absorbing material to apparatus 100, a person of ordinary skill in the art will further appreciate that depending on the apparatus the absorbing material is affixed to may only require one site to be affixed too and still provide adequate protection.

Placement of the impact absorbing material is determined by analyzing a host of different factors, such as, but not limited to, the mass of the transportable device, the placement of input and output connectors on the device in question, internal structure of the portable, positioning of input and output connectors, power cord placement, predicted fall pattern, typically fall height and the sturdiness of the portable housing.

Figure 7:
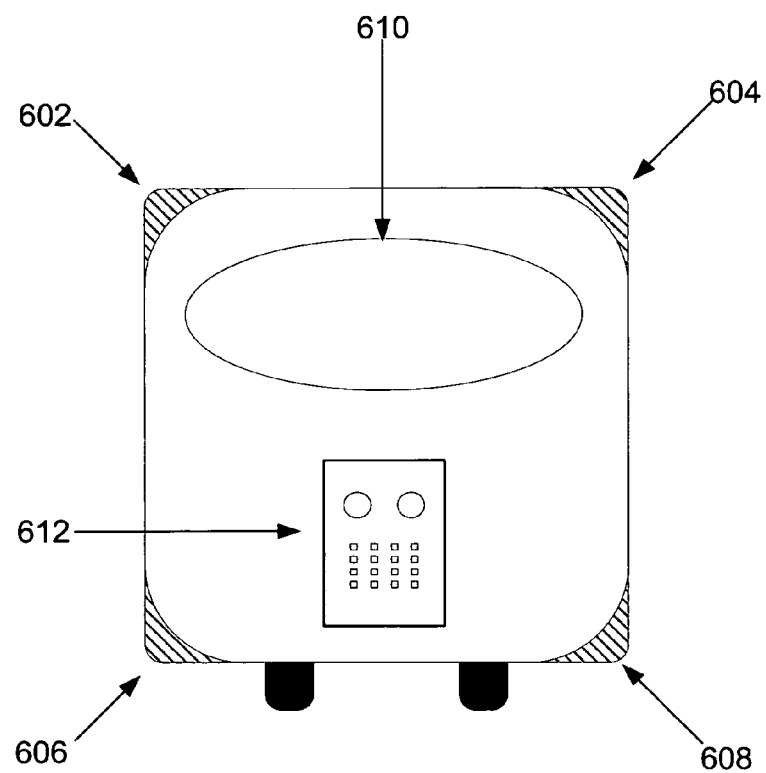
FIG. 7 is a diagram of a transportable device with crumple zones affixed to the transportable device according to an embodiment.

FIG. 7 is a diagram 700 of the impact absorbing material 602, 604, 606 and 608 affixed to the periphery of transportable device 102. It should be noted that in this embodiment the absorbing material has been adapted to conform to the contours of the transportable device 102, which due to its thin profile is considered as having four corners.

Figure 8:
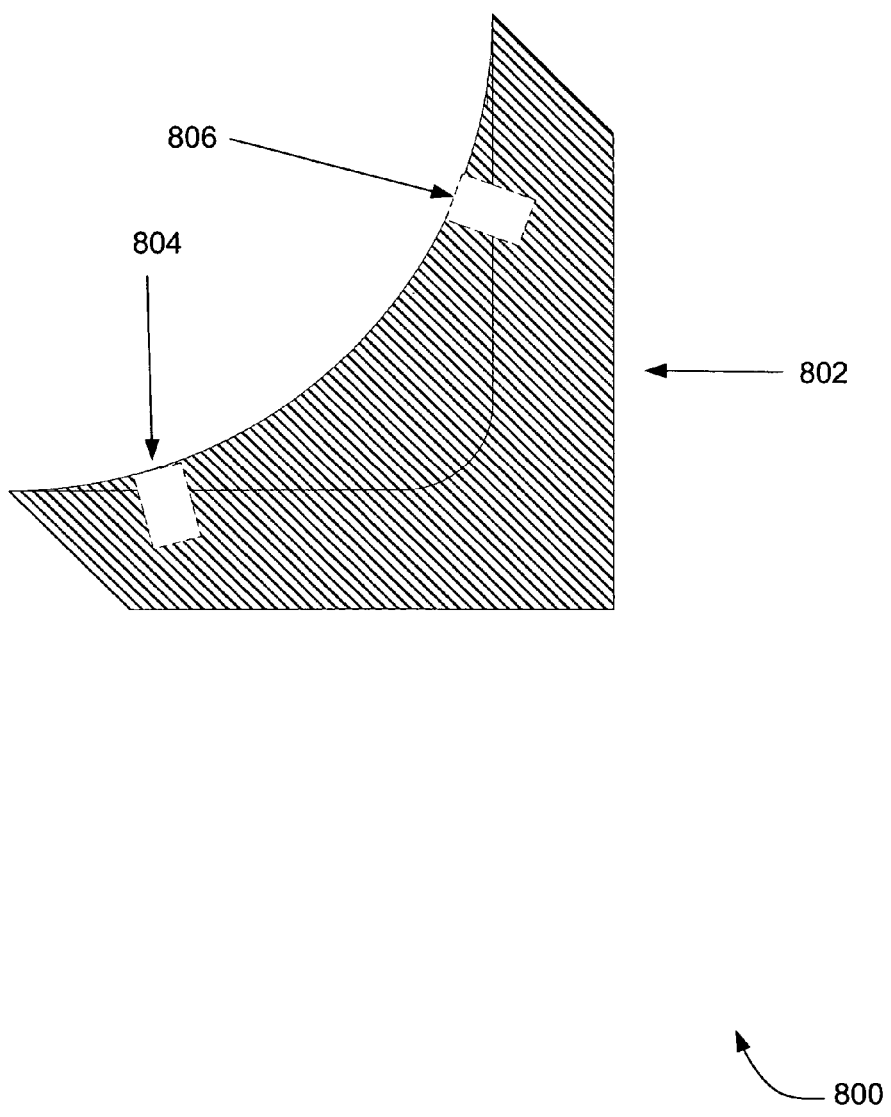
FIG. 8 is a diagram of a crumple zone adapted to be attached to a transportable device according to an embodiment.

FIG. 8 is a diagram of a crumple zone impacting material 800 of an embodiment. Crumple zone apparatus 802 further includes posts 804 and 806 for attaching the crumple zone material to a transportable device, such as those in FIGS. 22-27. To employ this embodiment the housing of the transportable device must be adapted to receive posts 804 and 806. To adhere crumple zone apparatus 802 to the portal device the user simply has to insert the post into the corresponding slot that has been provided. In this embodiment the crumple zone apparatus 802 can be removed easily when necessary because of damage or contamination. For example, in a hospital setting the device after use may need to be sterilized, therefore, the crumple zone apparatus 802 can be easily removed and sterilized or discarded and then replaced.

In another embodiment crumple zone apparatus 802 can be affixed to an outer housing of the transportable device by counter sinking a hole or access port through the crumple zone apparatus 802 to accommodate a fastener, such as a screw or bolt. A person of ordinary skill in the art will readily appreciate that there are many types of fasteners that can be utilized to secure the crumple zone apparatus the transportable device. Depending on the environment the hole or access port, can be modified to accept an O-ring to keep liquid and debris from reaching the internals of the transportable device.

In an alternate embodiment Velcro® or a similar attachment scheme can be utilized to adhere the crumple zone apparatus 802 to the housing of the transportable device. In this embodiment an epoxy or glue is applied to the Velcro® and adhered to the crumple zone apparatus 802 and the transportable device. This embodiment does not necessitate a modification of the transportable device to receive the crumple zone apparatus 802.

In an alternate embodiment, crumple zone apparatus 802 is glued or epoxied to the surface of the transportable device at one or more sites on its surface.

Figure 9:
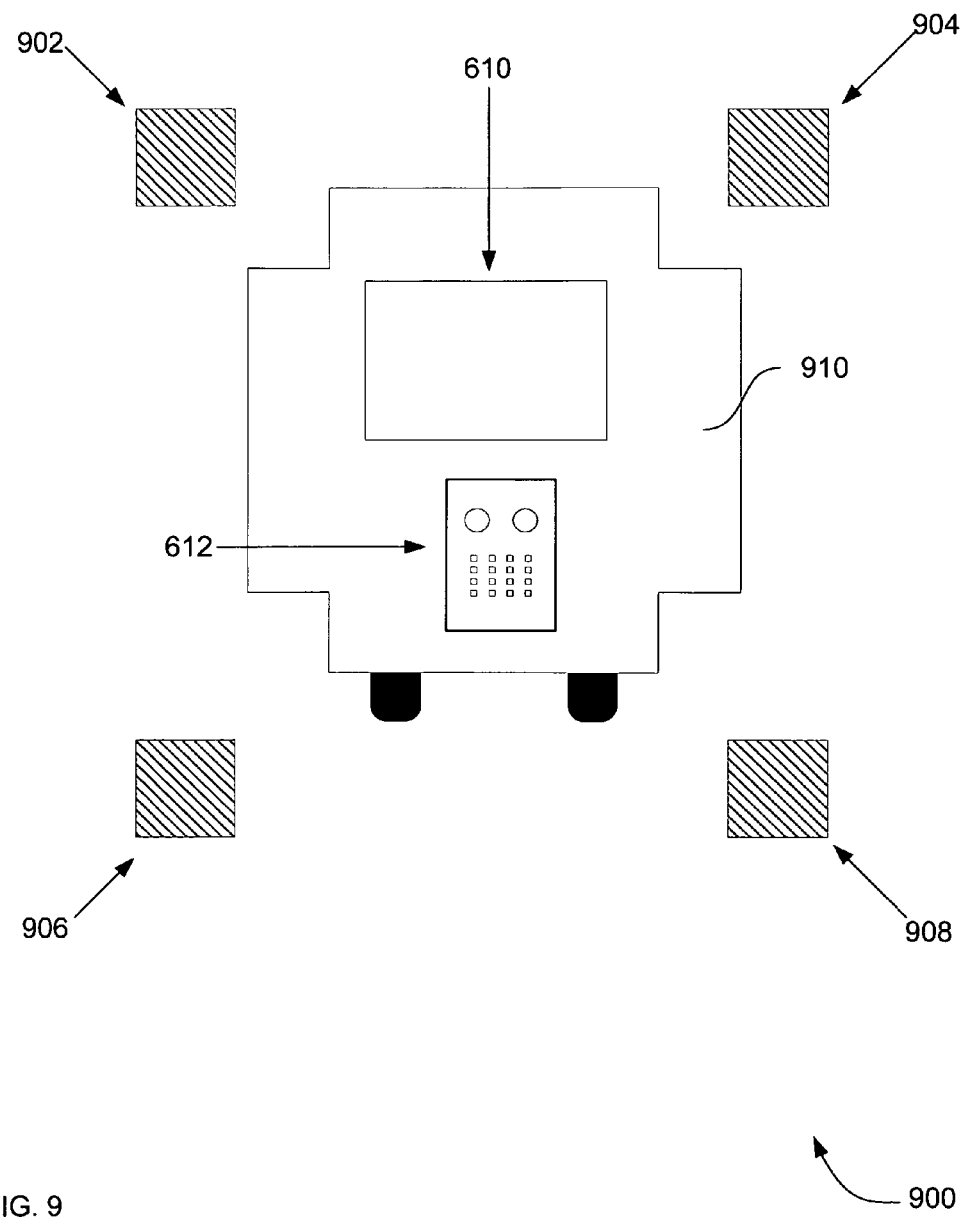
FIG. 9 is a diagram of an explode view of a transportable device with crumple zones detached to the transportable device according to an embodiment.

FIG. 9 is a diagram 900 of a transportable device with impact absorbing material 902, 904, 906 and 908 positioned in proximity to the impact absorbing material attachment location according to an embodiment. Transportable device 910 includes a display panel 610, controls 612 and impact absorbing material 902, 904, 906 and 908 strategically placed along the periphery of transportable device 910.

Figure 10:
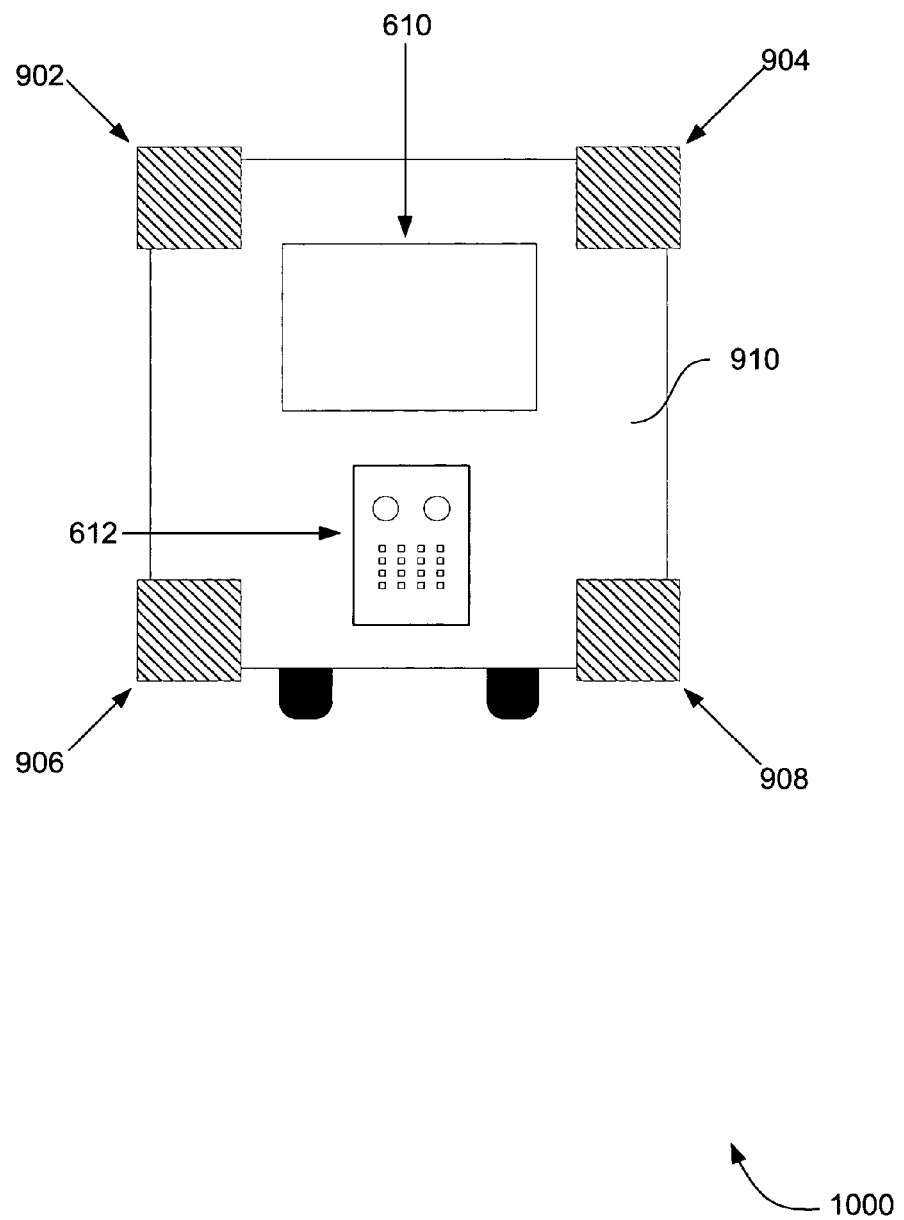
FIG. 10 is a diagram of a transportable device with crumple zones affixed to the transportable device according to an embodiment.

FIG. 10 is a diagram 1000 of the impact absorbing material 902, 904, 906 and 908 affixed to the periphery of transportable device 910. The absorbing material has been adapted to conform to the contours of the four corners of transportable device 910. Furthermore, transportable device 910 is been adapted to receive the impact absorbing material at its four corners as shown in FIG. 9.

Figure 11:
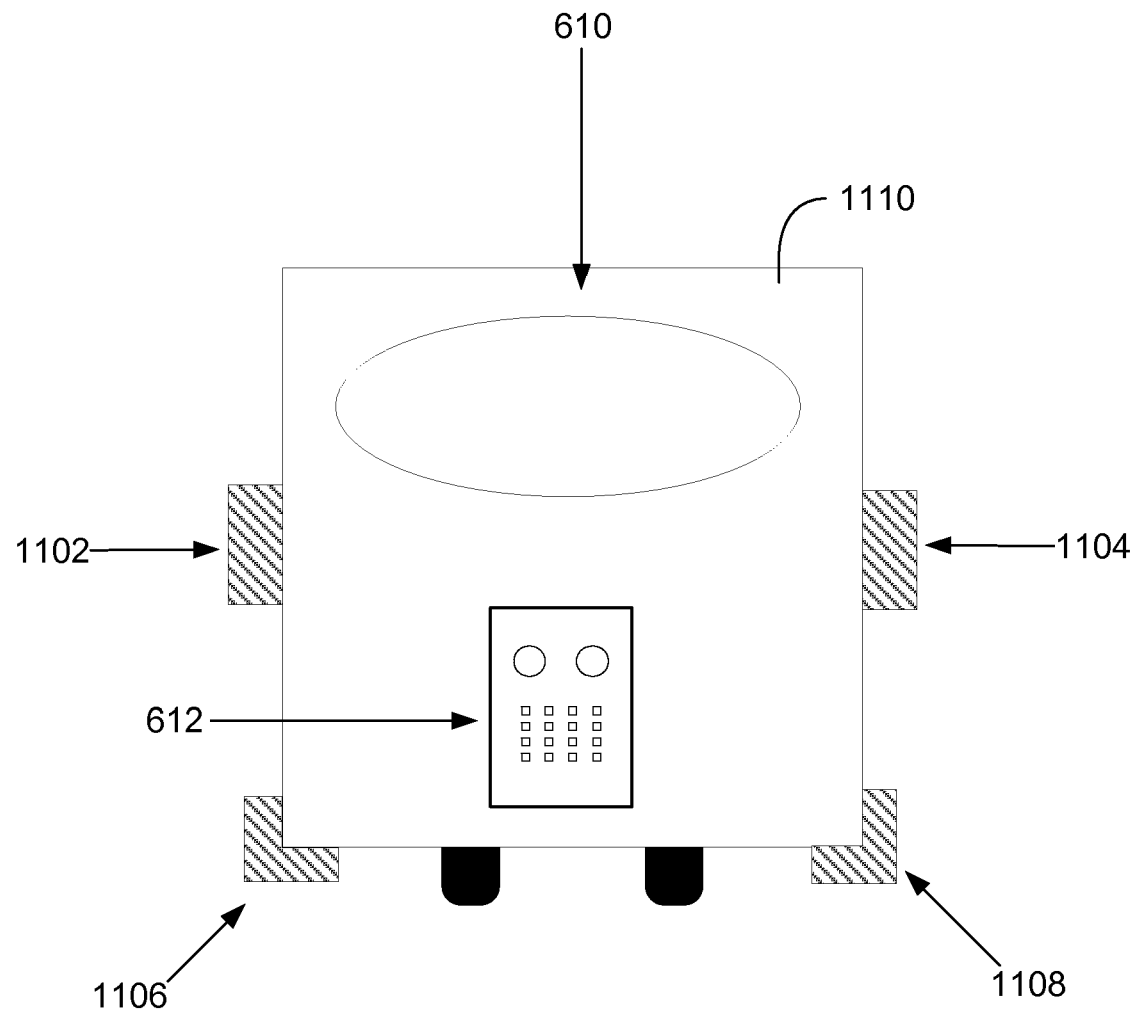
FIG. 11 is a diagram of a transportable device with crumple zones affixed to the transportable device according to an embodiment.

FIG. 11 is a diagram of an impact absorbing material 1102, 1104, 1106 and 1108 affixed to the periphery of transportable device 1110 in an embodiment. Transportable device 1110 includes a display panel 610 and controls 612. In this embodiment the absorbing material 1106 and 1108 are affixed at two corners of transportable device 1110 and absorbing material 1102 and 1104 at the midpoint of two sides of the transportable device 1110. A person of ordinary skill in the art will appreciate that absorbing material 1102 and 1104 can be positioned anywhere on the surface of transportable device 1110, depending on what configuration provides for the optimum protection for transportable device 1110 without impacting or minimally impacting the utility of transportable device 1110.

As shown in FIG. 11, in this embodiment the impact absorbing material has a substantially rectangular shape.

Figure 12:
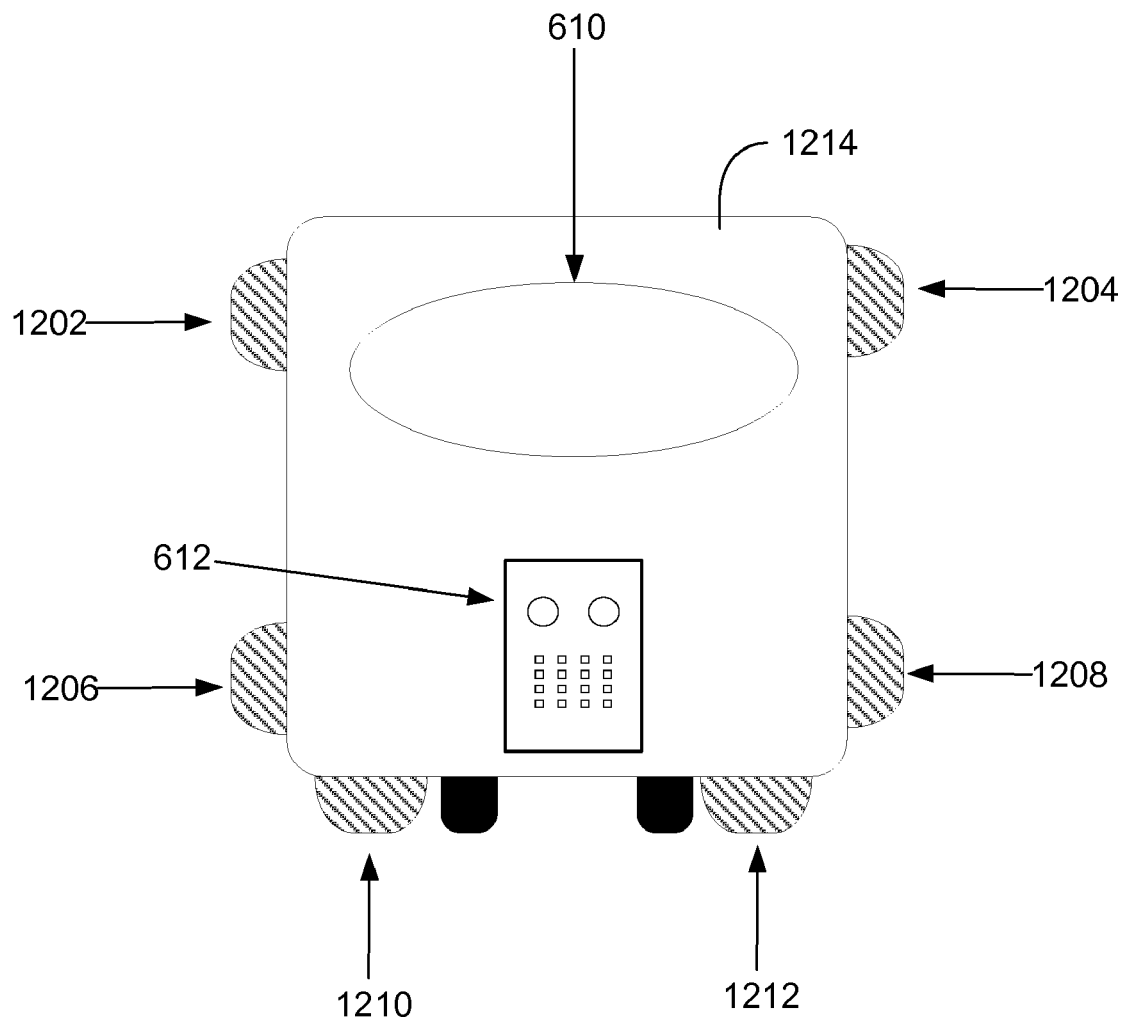
FIG. 12 is a diagram of a transportable device with crumple zones affixed to the transportable device according to an embodiment.

FIG. 12 is a diagram of an impact absorbing material 1202, 1204, 1206, 1208, 1210 and 1212 are affixed to a periphery of transportable device 1214 of an embodiment. Transportable device 1214 includes display panel 610 and controls 612. In this embodiment the absorbing material 1210 and 1214 are disposed beneath transportable device 1214 to provide additional protection to the underside of transportable device 1214.

The reader should note that in FIGS. 9-12 the two-dimensional representations show only four corners or sides. In an actual device with a typical rectangular form would have eight potential corners where the impact absorbing material can be employed as well as both sides, a top, a bottom, front and back for a total of generally 6 surfaces in addition to the generally 8 corners upon which the impact absorbing material can be employed.

Figure 13:
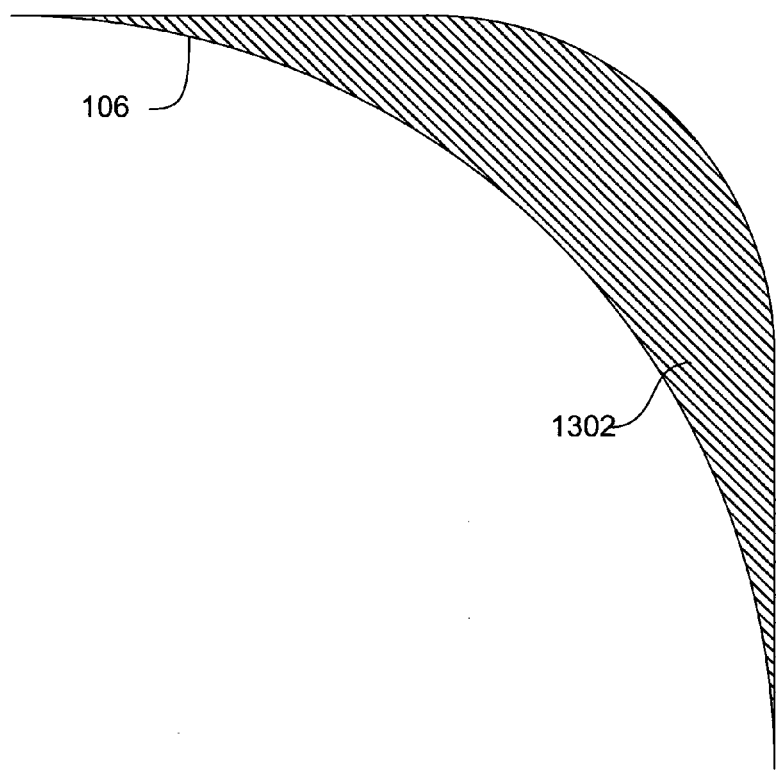
FIG. 13 is a cross section diagram of impact absorbing material including crumple zone material, according to an embodiment.

FIG. 13 is a cross section diagram of impact absorbing material including crumple zone material, according to an embodiment. Apparatus 1300 solves the need in the art to protect transportable devices against shock and to provide the end user with information on the extent, if any at all, of the severity of an impact event.

In FIG. 13, the impact absorbing material 106 includes a crumple zone material 1302. A crumple zone is an area that is designed to plastically deform or crumple on impact in such a way as to absorb a portion of the energy of an impact, thus slowing down the rate of deceleration when an impact occurs. Crumple zones are also known as deformation zones.

In apparatus 1300 the crumple zone material 1302 is a material that is designed to effectuate a crumple zone. Various embodiments of the crumple zone material 1302 are shown in FIGS. 14, 15, 16, 17, 18, 19, 20 and 21 below.

In some embodiments, the crumple zone material 1302 is tuned to absorb a predetermined number of impact events before the crumple zone material 1302 is permanently deformed. For example, the crumple zone material 1302 is tuned to absorb four impact events before the effectiveness of the crumple zone material 1302 is depleted. Crumple zone material 1302 that absorbs the mechanical energy of a predetermined number of impact events before permanently deforming provides protection against shock that an elastomeric bumper on a transportation vehicle provides, but at the same time alerts both the end user and the device manufacturer when the transportable device has been mishandled.

In some embodiments, the crumple zone material 1302 includes a veneer (not shown) that is formed integral with the crumple zone material.

Figure 14:
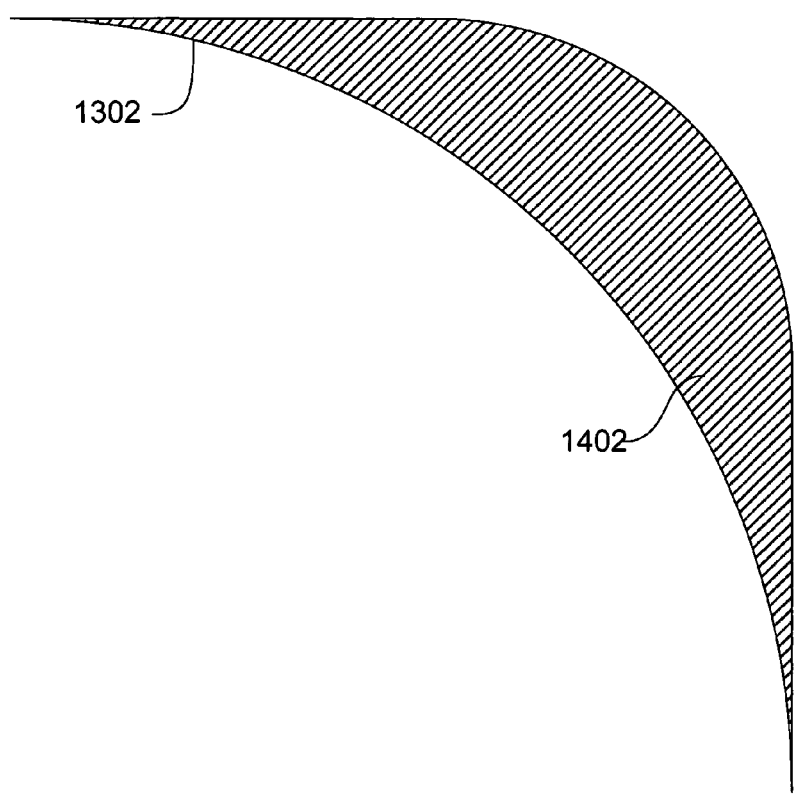
FIG. 14 is a cross section diagram of metallic crumple zone material, according to an embodiment.

FIG. 14 is a cross section diagram of metallic crumple zone material, according to an embodiment. In FIG. 14, the crumple zone material 1302 of apparatus 1400 includes a metallic material 1402.

FIG. 15 is a cross section diagram of organic crumple zone material, according to an embodiment. In FIG. 15, the crumple zone material 1302 of apparatus 1500 includes a paper or cardboard material 1502.

Figure 16:
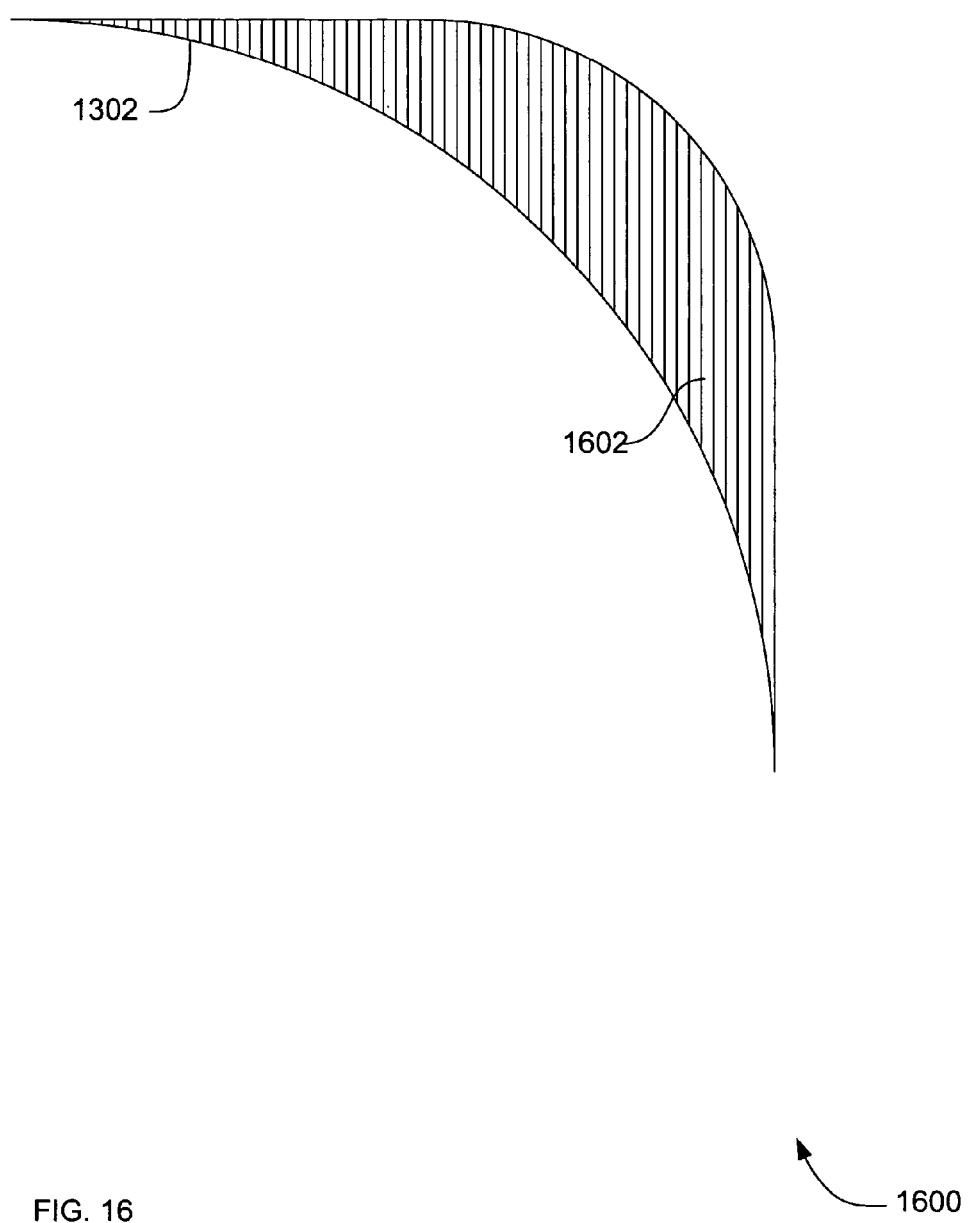
FIG. 16 is a cross section diagram of composite crumple zone material, according to an embodiment.

FIG. 16 is a cross section diagram of composite crumple zone material, according to an embodiment. In FIG. 16, the crumple zone material 1302 of apparatus 1600 includes a composite material 1602.

Figure 17:
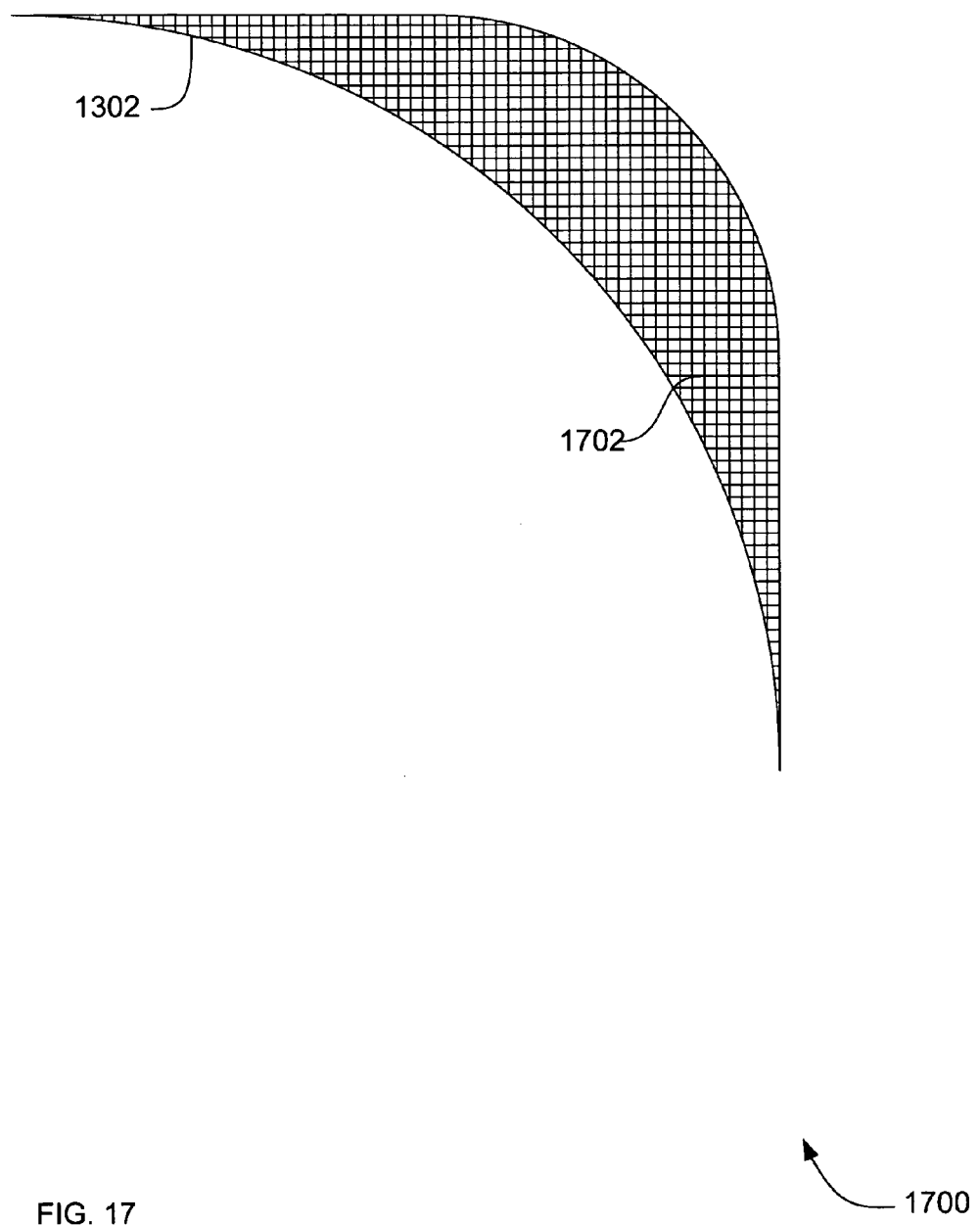
FIG. 17 is a cross section diagram of symmetrical cellular crumple zone material, according to an embodiment.

FIG. 17 is a cross section diagram of symmetrical cellular crumple zone material, according to an embodiment. In FIG. 17, the crumple zone material 1302 of apparatus 1700 includes a plurality of symmetrical cells 1702. In various embodiments, the symmetrical cellular crumple zone material includes honeycomb type cells, void regions dispersed among the symmetrical cells, triangular type cells, pentagonal or hexagonal type cells.

Figure 18:
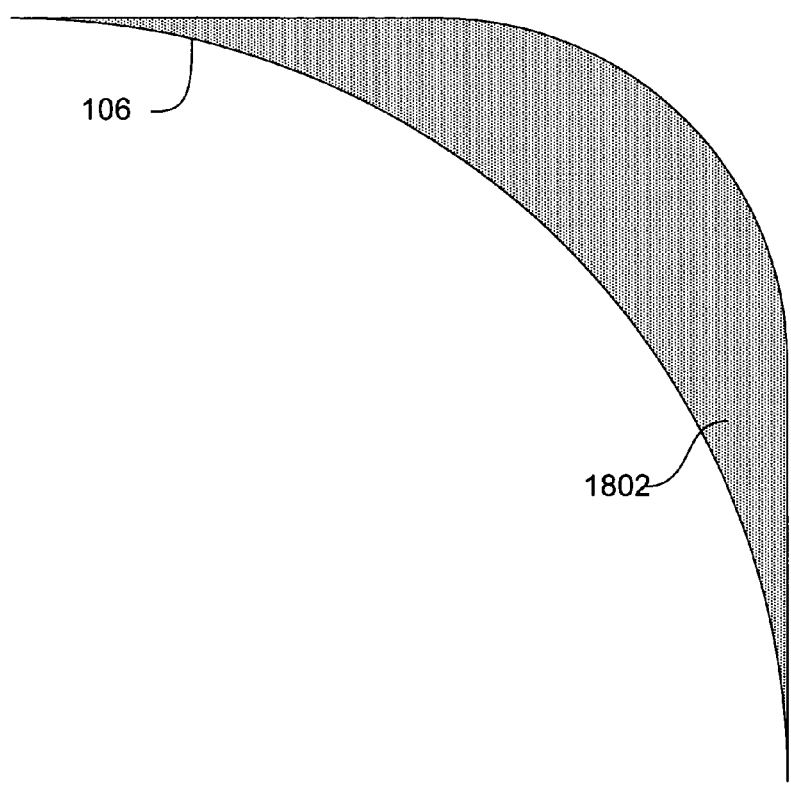
FIG. 18 is a cross section diagram of asymmetrical cellular crumple zone material, according to an embodiment.

FIG. 18 is a cross section diagram 1800 of asymmetrical cellular crumple zone material, according to an embodiment. In FIG. 18, the crumple zone material 1302 includes a plurality of asymmetrical cells 1802. In various embodiments, the asymmetrical cellular crumple zone material includes honeycomb type cells, void regions dispersed among the asymmetrical cells, triangular type cells, pentagonal and/or hexagonal type cells.

Figure 19:
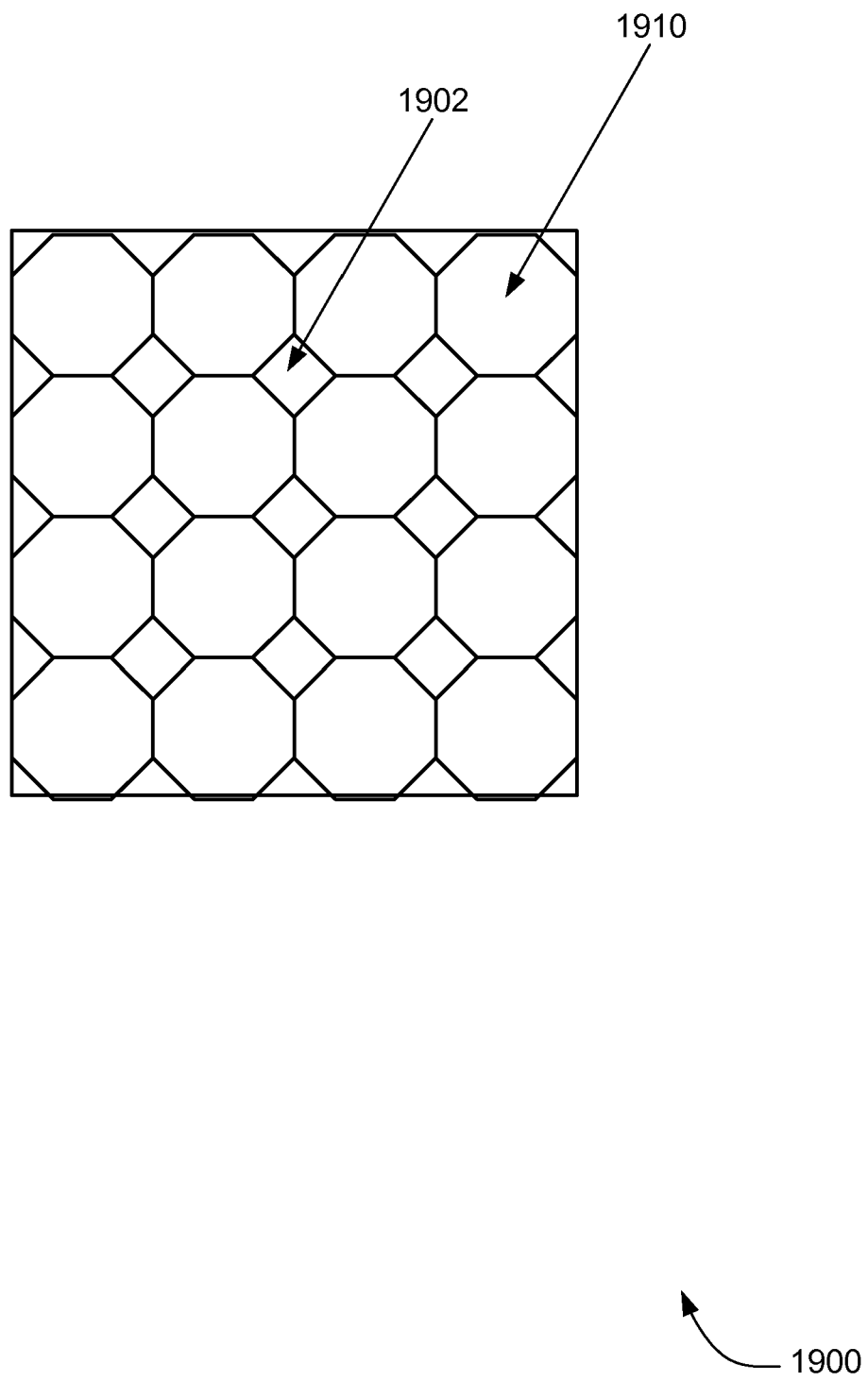
FIG. 19 is a cross section diagram of octagonal cellular crumple zone material, according to an embodiment.

FIG. 19 is a cross section diagram of octagonal cellular crumple zone material, according to an embodiment. 1910 is an octagonal cellular crumple zone material 1900 including void regions 1902.

Figure 20:
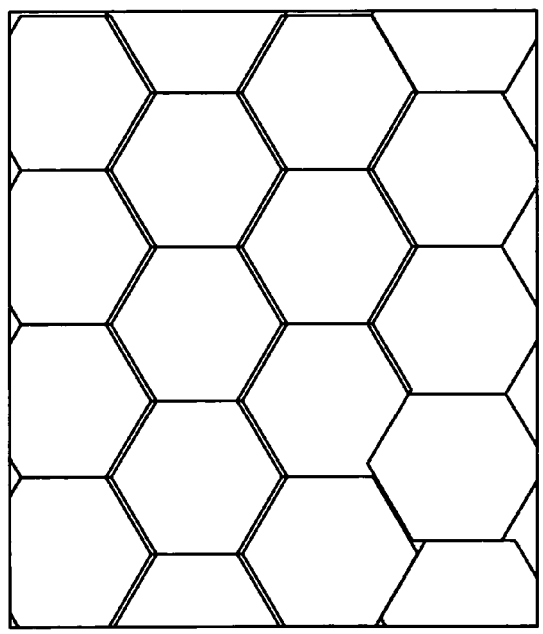
FIG. 20 is a cross section diagram of honeycomb symmetrical cellular crumple zone material, according to an embodiment.

FIG. 20 is a cross section diagram of honeycomb symmetrical cellular crumple zone material, according to an embodiment. Honeycomb cell crumple zone material 2000 has no substantial voids.

Figure 21:
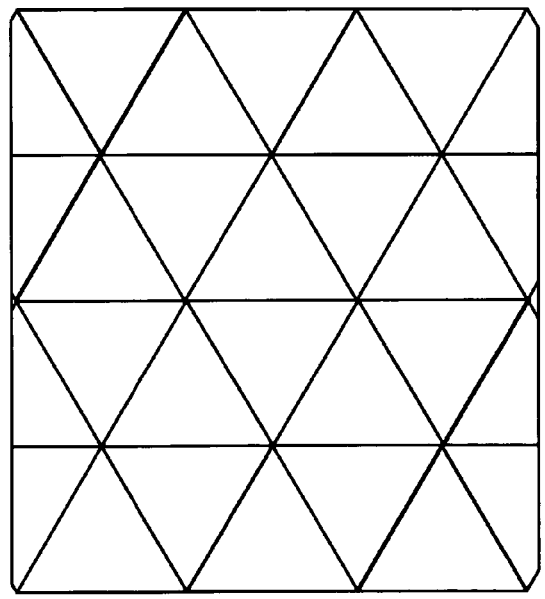
FIG. 21 is a cross section diagram of triangular symmetrical cellular crumple zone material, according to an embodiment.

FIG. 21 is a cross section diagram of triangular symmetrical cellular crumple zone material, according to an embodiment. Triangular cell crumple zone material 2100 is shown in FIG. 21.

FIGS. 13-21 are illustrative and not exhaustive of the possible crumple zone cell configurations. The choice of the construction of the crumple zone is based the characteristic of the transportable device, such as mass, dimensions, typical drop or tip-over height and criticality of the transportable device. Furthermore, if the crumple zone material (i.e. impact absorbing material) is intend to withstand multiple impacts before impact absorbing properties are depleted the cell structure as well as composition of the crumple material has to be tuned to provide the desired crumple zone material characteristics.

Additionally, an embodiment contemplates the adding of a veneer to the outer surface of the crumple zone material. For instance, a crumple zone cell can be formed utilizing the honeycomb cell 1900 made of cardboard with a rubber outer shell. To this rubber outer shell (not shown) a veneer, such as a silver foil or other material to provide a more visible surface to aide the end user or operator in detecting an impact event and to take action if necessary.

FIGS. 22-27 are diagrams of portal devices, which would benefit from the impact absorbing material and the embodiments described above. FIGS. 22-27 are illustrative and not exhaustive as to the myriad kinds of transportable devices that would benefit form the teachings, as a person of ordinary skill in the art will readily appreciate.

Figure 22:
FIG. 22 is diagram of a cell phone, according to an embodiment.

FIG. 22 is diagram of a cell phone, according to an embodiment. A cell phone 2200 is one example of a transportable device that can be protected from impact absorbing material 106.

Figure 23:
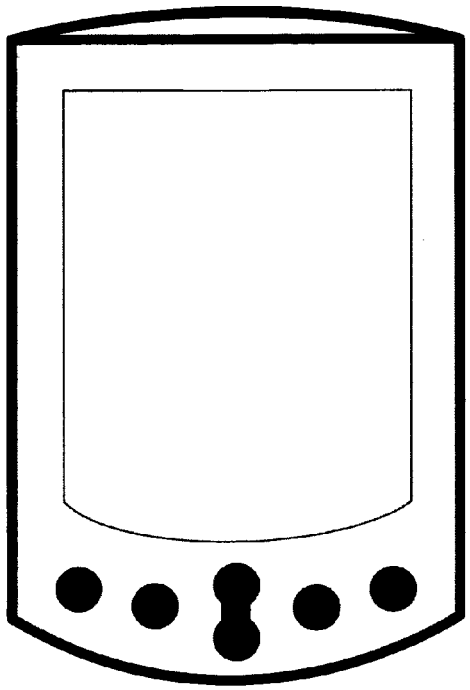
FIG. 23 is diagram of a Personal Digital Assistant (PDA), according to an embodiment.

FIG. 23 is diagram of a Personal Digital Assistant (PDA), according to an embodiment. A PDA 2300 is one example of a transportable device that can be protected from impact absorbing material 106.

Figure 24:
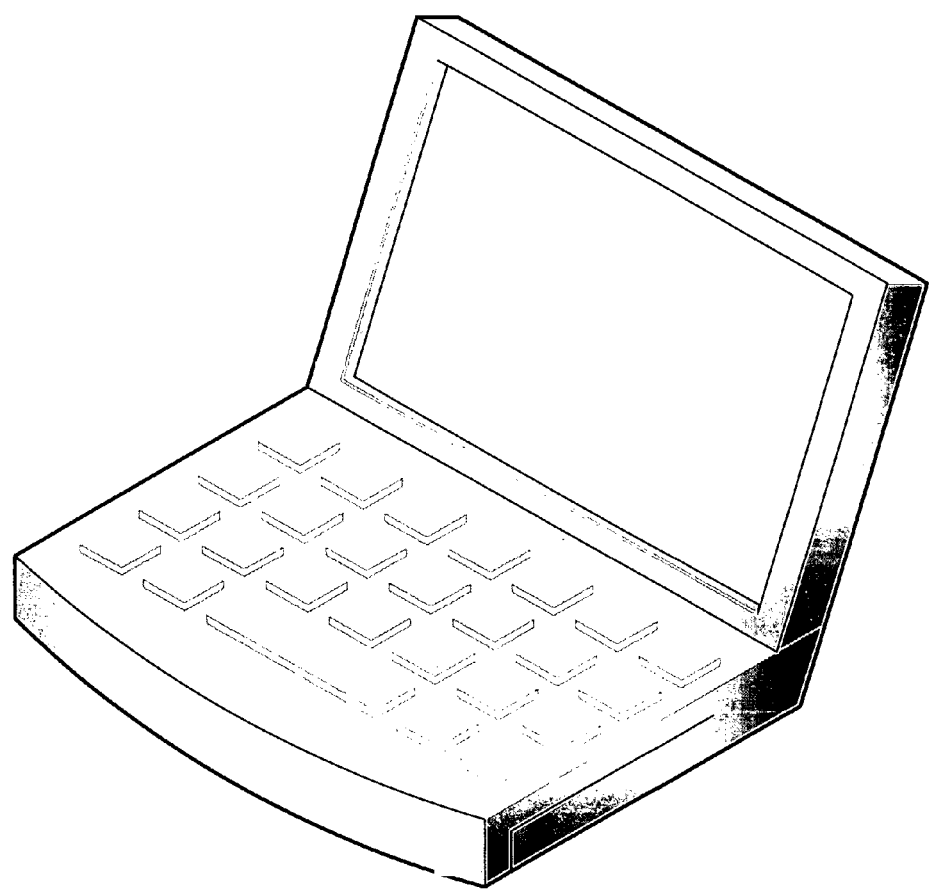
FIG. 24 is diagram of a laptop computer, according to an embodiment.

FIG. 24 is diagram of a laptop computer, according to an embodiment. A laptop computer 2400 is one example of a transportable device that can be protected from impact absorbing material 106.

Figure 25:
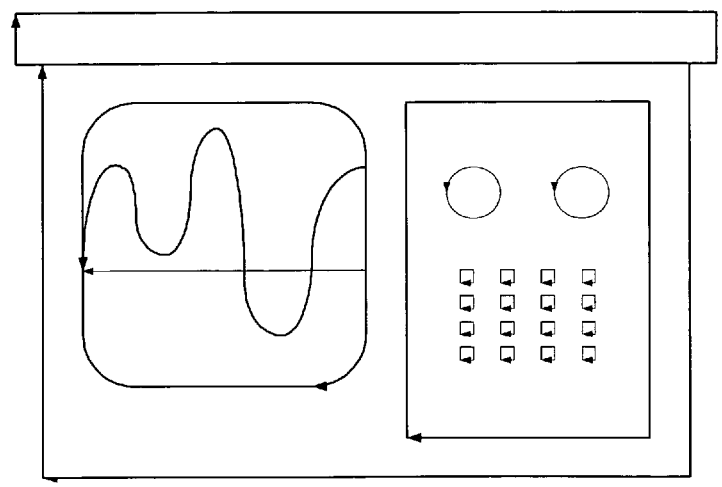
FIG. 25 is diagram of an oscilloscope, according to an embodiment.

FIG. 25 is diagram of an oscilloscope, according to an embodiment. A oscilloscope 2500 is one example of a transportable device that can be protected from impact absorbing material 106.

Figure 26:
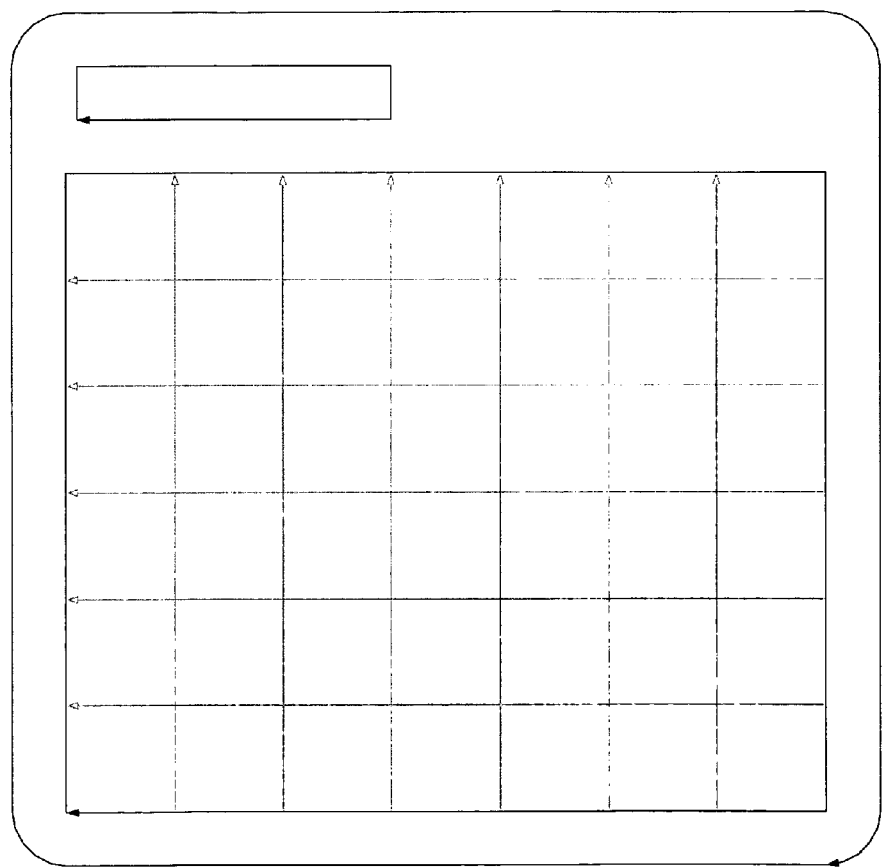
FIG. 26 is diagram of an electronic tablet, according to an embodiment.

FIG. 26 is diagram of an electronic tablet, according to an embodiment. An electronic tablet 2600 is one example of a transportable device that can be protected from impact absorbing material 106.

Figure 27:
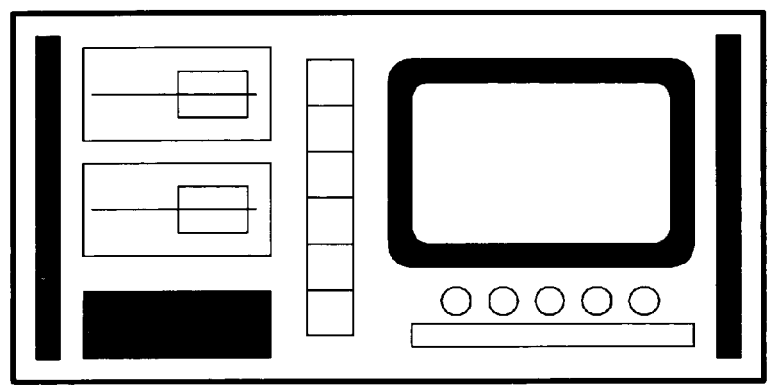
FIG. 27 is diagram of a medical device, according to an embodiment.

FIG. 27 is a diagram of a medical device, according to an embodiment. Examples of medical device 2700 include an ultra-sound monitor, a defibrillator or an X-ray device. Medical device 2700 is one example of a transportable device that can be protected from impact absorbing material 106.

Figure 28:
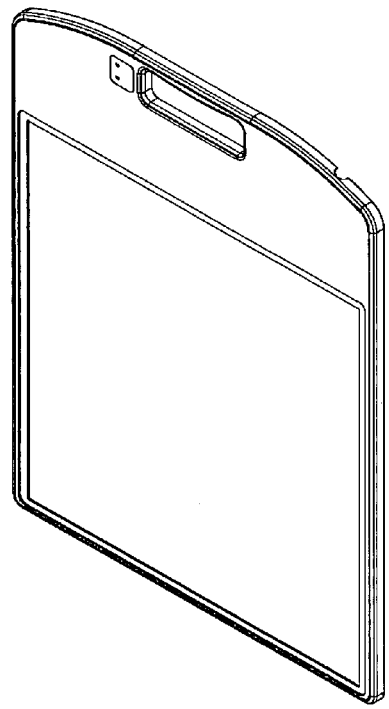
FIG. 28 is a diagram of an electronic X-Ray detector, according to an embodiment.

FIG. 28 is a diagram of an electronic X-Ray detector, according to an embodiment. Electronic X-Ray detector 2800 is one example of a transportable device that can be protected from an impact absorbing material 106.

Each of the devices in FIGS. 22-28 can and often do experience a severe impact when dropped or tipped over. Although the manufacturing process employs techniques to protect the transportable devices from the impact events, the devices are not impregnable and an impact where a majority of the force from a fall is directed to a corner or other surface often does damage to the transportable device necessitating repair.

In order to provide additional protection to the transportable devices, carrying cases, leather covers etc. are employed by the various industries as well as end users. Although these covers and carrying cases do provide a modicum of additional protection, it is usually with a view to prevent visual blemishes to the devices. As a result, these protecting devices do not provide for a visual cue as to the severity or the number of impact events that have occurred. This is information can be very critical, especially in a medical emergency when the portable equipment is being transferred from one location to another, such as in an ambulance or hospital. By providing a visual cue to the operator of the device that it has been recently dropped or severely jarred the operator is given an opportunity to select another transportable device or have the transportable device inspected and maintenance performed on it before it is placed back in service. For use in life threatening situations, this type of a visual feedback is critical to prevent the use of a malfunctioning or an inoperable device.

The visual cue is provided by a crumple zone technology, here-to-fore utilized mainly in the automotive industry. Crumple zones are deliberate weak spots placed in a structure. By placing the weak spots in strategic locations, the material is made to collapse in a controlled manner. This creates two mechanisms by which the energy from an impact can be managed.

First is a deforming of the absorbing material so that energy from an impact gets "used up" or converted into heat. This reduces the amount of energy to damage the transportable device. Secondly, since the collapse is controlled, energy from the impact is directed away from the sensitive or less sturdy areas of the transportable device.

The absorbing material of the several embodiments employs crumple technology, thus proving the end user or operator with a visual cue as to the severity of the impact or amount of force imparted via several impact events.

Methods

Figure 29:
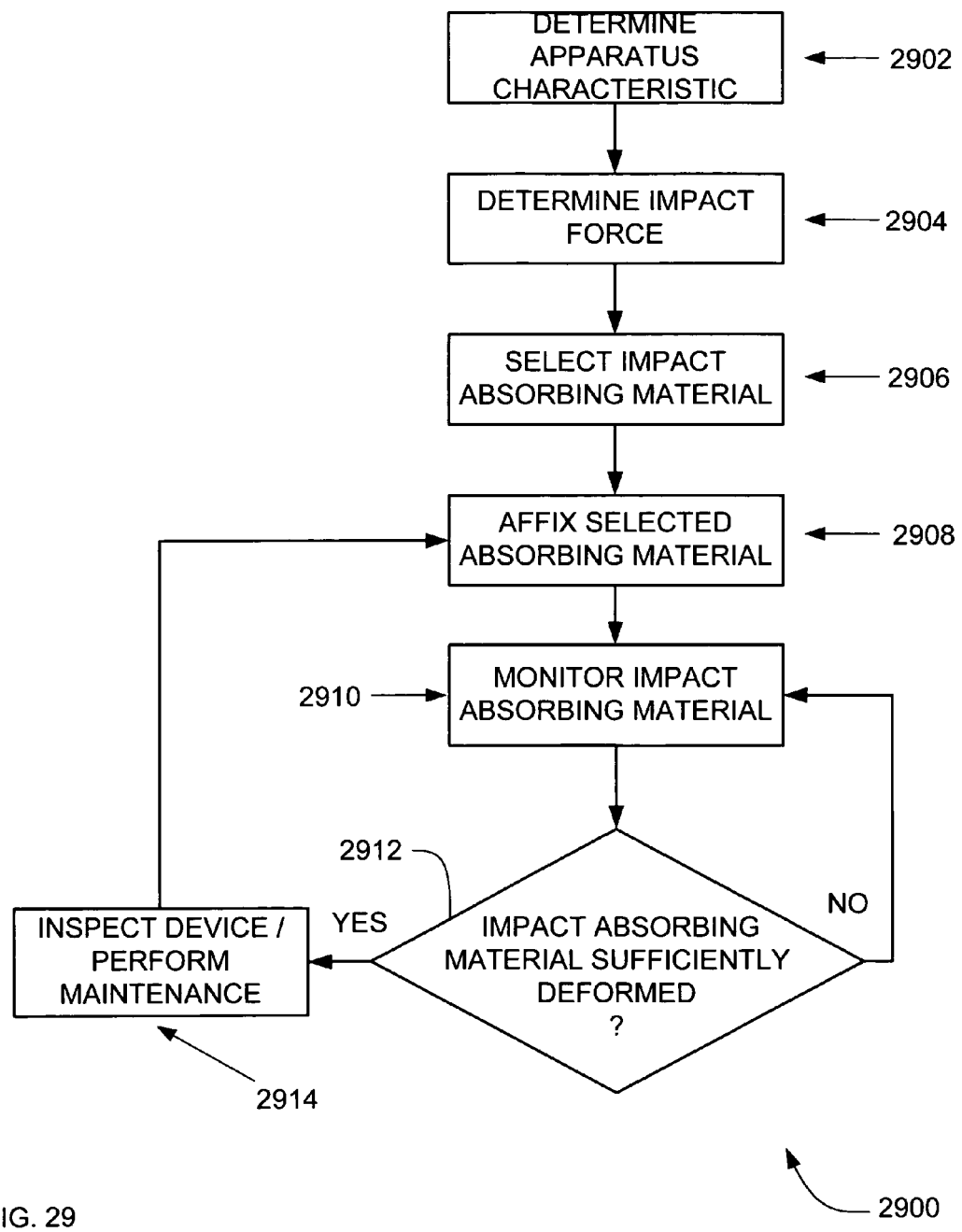
FIG. 29 is a schematic diagram of a method, according to an embodiment.

FIG. 29 is a schematic diagram of a method, according to an embodiment. FIG. 29 depicts a flowchart of actions 2900 taken in selecting and replacing a crumple zone material. At action 2902 the transportable device characteristics are determined. This includes weight, dimensions of the product and any specification provided by the manufacture of the transportable device. At action 2904 a determination is made as to the potential impact force that will be exerted for a given distance a fall, such as 1-1.5 meters. Any distance fall or tip over can be chosen at this action.

At action 2906, a crumple zone type impact absorbing material is selected. Based on the energy absorbing characteristics that are desired for the particular transportable device a selection is made from a plurality of choices. For example a metallic type crumple zone material could be chosen with a octagonal cell structure 1900 with voids 1902, as shown in FIG. 19, an a rubber outer surface with a silver veneer. Based on the mass of the transportable device and the areas that would be impacted most severely by a direct impact, one or more crumple zone apparatuses are affixed to the surface of the transportable device by any of the methods described above.

The selected crumple zone absorbing material is affixed to the transportable device surface 2908. At action 2910 the crumple zone impact absorbing material is inspected periodically or monitored when used. At action 2912 a determination is made as to whether visual evidence indicates that an impact has sufficiently deformed the crumple zone impact absorbing material to a point where it no longer can provide adequate protection for the transportable device. If no evidence of impact is present or the visual cue provided by the crumple zone material does not rise to the level of needing further inspection or maintenance, the process loops back to action 2910. If evidence of numerous impact or a severe impact event is present, the process proceeds to action 2914 where personnel in charge of maintaining the transportable devices or a technician will perform a diagnostic test on the device and/or effectuate routine maintenance before returning the device to service. The process then proceeds to action 2908 where crumple zone absorbing material is once again affixed to the transportable device and the process continues.

Conclusion

System, methods and apparatus for an energy absorbing device are described. Although specific embodiments are illustrated and described herein, it will be appreciated by those of ordinary skill in the art that any arrangement which is calculated to achieve the same purpose may be substituted for the specific embodiments shown. This application is intended to cover any adaptations or variations.

In particular, one of skill in the art will readily appreciate that the names of the methods and apparatus are not intended to limit embodiments. Furthermore, additional methods and apparatus can be added to the components, functions can be rearranged among the components, and new components to correspond to future enhancements and physical devices used in embodiments can be introduced without departing from the scope of embodiments. One of skill in the art will readily recognize that embodiments are applicable to future devices, different impact absorbing materials, and new crumple zone materials.

The terminology used in this application is meant to include all environments and alternate technologies which provide the same functionality as described herein

I claim:

1. An apparatus for absorbing an impact imparted to an electronic X-ray detector, the apparatus comprising:
   the electronic X-ray detector; and
   an crumple zone material affixed to the exterior of the electronic X-ray detector, wherein the crumple zone material is permanently deformed upon encountering an impact event,
   wherein the crumple zone material in deforming converts some of the energy of the impact event to heat and directs some of the energy of the impact away from sensitive or less sturdy areas of the electronic X-ray detector and that provides information on the extent of the severity of the impact event indicating a need to perform a diagnostic test on the electronic X-ray detector and effectuate routine maintenance on the electronic X-ray detector,
   wherein the crumple zone material further comprises a plurality of honeycomb symmetrical cells.

2. The apparatus of claim 1, wherein the electronic X-ray detector further comprises:
   a solid-state X-ray detector.

3. The apparatus of claim 1, wherein the crumple zone material further comprises:
   a rubber outer surface.

4. The apparatus of claim 3, wherein the rubber outer surface further comprises:
   a silver foil veneer.

5. The apparatus of claim 1, wherein the crumple zone material further comprises:
   asymmetrical cells.

6. The apparatus of claim 1, wherein the crumple zone material further comprises:
   a metallic material.

7. The apparatus of claim 1, wherein the crumple zone material further comprises:
   a paper or cardboard material.

8. The apparatus of claim 1, wherein the crumple zone material further comprises:
   a composite material.

9. The apparatus of claim 1, wherein the crumple zone material has no substantial voids.

10. The apparatus of claim 1, wherein the crumple zone material has void regions dispersed among the asymmetrical cells.

11. The apparatus of claim 1, wherein the honeycomb symmetrical cells are made of cardboard with a rubber outer shell.

12. The apparatus of claim 1, wherein the crumple zone material is further attached to at least one surface of the electronic X-ray detector.

13. The apparatus of claim 1, wherein the electronic X-ray detector is further adapted to receive the crumple zone material.

14. The apparatus of claim 1, wherein the crumple zone material is further attached to at least one corner of the electronic X-ray detector.

15. The apparatus of claim 1, wherein the crumple zone material is further attached to a plurality of corners of the electronic X-ray detector.

16. An apparatus comprising:
    a solid-state X-ray detector having four corners; and
    a crumple zone material attached to each of the four corners of the solid-state X-ray detector, the crumple zone material having a pre-impact shape, wherein the crumple zone material reforms to the pre-impact shape, and wherein the crumple zone material is tuned to absorb an impact event whereupon the crumple zone material becomes permanently deformed by a force exerted on the crumple zone material,
    wherein the crumple zone material provides information on the extent of the severity of the impact event indicating a need to perform a diagnostic test on the electronic X-ray detector and effectuate routine maintenance on the electronic X-ray detector,
    wherein the crumple zone material further comprises a plurality of honeycomb symmetrical cells.

17. The apparatus of claim 16, wherein the apparatus further comprises:
    at least one screw attaching the crumple zone material to the solid-state X-ray detector.

18. The apparatus of claim 16, wherein the apparatus further comprises:
    at least one snap attaching the crumple zone material to the solid-state X-ray detector.

19. An electronic X-ray detector comprising:
    a solid-state X-ray detector having four corners; and
    a means to absorb an impact event whereupon the means becomes permanently deformed upon the impact event from another object, wherein the means is affixed to each of the four corners of the solid-state X-ray detector, wherein the impact event has a force, wherein the means to absorb further comprises crumple zone material,
    wherein the crumple zone material provides information on the extent of the severity of the impact event indicating a need to perform a diagnostic test on the electronic X-ray detector and effectuate routine maintenance on the electronic X-ray detector,
    wherein the crumple zone material further comprises a plurality of honeycomb symmetrical cells.

20. The electronic X-ray detector of claim 19, wherein the crumple zone material further includes a plurality of symmetrical cells.

* * * * *